(12) United States Patent
Sunohara

(10) Patent No.: US 7,198,986 B2
(45) Date of Patent: Apr. 3, 2007

(54) ELECTRONIC PARTS BUILT-IN SUBSTRATE AND METHOD OF MANUFACTURING THE SAME

(75) Inventor: Masahiro Sunohara, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 99 days.

(21) Appl. No.: 11/049,958

(22) Filed: Feb. 4, 2005

(65) Prior Publication Data
US 2005/0130349 A1 Jun. 16, 2005

Related U.S. Application Data

(62) Division of application No. 10/918,348, filed on Aug. 16, 2004, now abandoned.

(30) Foreign Application Priority Data
Sep. 29, 2003 (JP) ............................ 2003-337323

(51) Int. Cl.
*H01L 21/44* (2006.01)
*H01L 21/48* (2006.01)
*H01L 21/50* (2006.01)

(52) U.S. Cl. .................... 438/109; 438/108

(58) Field of Classification Search ............... 438/108, 438/109
See application file for complete search history.

(56) References Cited

U.S. PATENT DOCUMENTS

| | | | | |
|---|---|---|---|---|
| 5,646,828 | A | * | 7/1997 | Degani et al. ............... 361/715 |
| 6,335,571 | B1 | * | 1/2002 | Capote et al. ............... 257/787 |
| 6,369,448 | B1 | * | 4/2002 | McCormick ................ 257/777 |
| 2004/0036152 | A1 | * | 2/2004 | Harper et al. ............... 257/666 |

FOREIGN PATENT DOCUMENTS

JP 11-274734 10/1999

* cited by examiner

*Primary Examiner*—Phat X. Cao
(74) *Attorney, Agent, or Firm*—Armstrong, Kratz, Quintos, Hanson & Brooks, LLP

(57) ABSTRACT

An electronic parts built-in substrate of the present invention includes a wiring substrate having connecting pads, a first electronic parts a bump of which is flip-chip connected to the connecting pad, a second electronic parts having a larger area than an area of the first electronic parts a bump of which is flip-chip connected to the connecting pad arranged on an outside of a periphery of the first electronic parts and which is packaged at a predetermined interval over the first electronic parts, and a filling insulating body filled in a clearance between the first electronic parts and the wiring substrate and clearances between the second electronic parts and the first electronic parts and the wiring substrate, wherein the first electronic parts is buried in the filling insulating body.

5 Claims, 8 Drawing Sheets

ELECTRONIC PARTS BUILT-IN SUBSTRATE AND METHOD OF MANUFACTURING THE SAME

This application is a divisional application of prior application Ser. No. 10/918,348, filed Aug. 16, 2004, abandoned.

BACKGROUND OF THE INVENTION

1. Field of the Invention

The present invention relates to an electronic parts built-in substrate and, more particularly, an electronic parts built-in substrate having a structure in which electronic parts are packaged in a multi-layered fashion in a state that these electronic parts are buried in insulating films and a method of manufacturing the same.

2. Description of the Prior Art

The development of the LSI technology serving as a key technology to implement the multimedia devices is proceeding steadily to a higher speed and a larger capacity in data transmission. With this development, a higher density in the packaging technology serving as the interface between LSI and the electronic device is advanced.

In reply to the request for the higher density, the electronic parts built-in substrate having the structure in which electronic parts are packaged on the wiring substrate in a multi-layered fashion in a state that semiconductor chips are buried in the insulating film was developed. As an example, in Patent Literature 1 (Patent Application Publication (KO-KAI) Hei 11-274734), it is set forth that the multi-layered wiring structure is formed by flip-chip connecting a bare chip on the wiring substrate, then forming an insulating film on the bare chip, then forming wiring patterns on the insulating film, and then repeating these steps plural times.

Meanwhile, in the production of the above electronic parts built-in substrate, upon forming the insulating film on the semiconductor chip, such insulating film is formed in the situation that a level difference is caused due to a thickness of the semiconductor chip. If the level difference is caused in the insulating film on the semiconductor chip, defocus is liable to occur in the photolithography applied to form the wiring patterns on the insulating film. Thus, it becomes difficult to form the wiring patterns on the insulating film with good precision.

Further, since a level difference is also caused in the wiring patterns formed on the insulating film, there is a possibility of lowering the reliability of the electric bonding applied to flip-chip bond the upper semiconductor chip to the wiring patterns.

Therefore, the technology capable of forming easily the flat insulating film on the semiconductor chip is desired.

SUMMARY OF THE INVENTION

It is an object of the present invention to provide an electronic parts built-in substrate in which an electronic part is buried in insulating films and packaged at low cost with good reliability to cause no disadvantage, and a method of manufacturing the same.

The present invention is relevant to an electronic parts built-in substrate that comprises a wiring substrate including a wiring pattern having connecting pads, a first electronic part a bump of which is flip-chip connected to the connecting pad, a second electronic part a bump of which is flip-chip connected to the connecting pad arranged on an outside of a periphery of the first electronic part and which is packaged at a predetermined interval from an upper surface of the first electronic part, and a filling insulating body filled in a clearance between the first electronic part and the wiring substrate and clearances between the second electronic part and the first electronic part and the wiring substrate, wherein the first electronic part is buried in the filling insulating body.

In the electronic parts built-in substrate of the present invention, first the bumps of the first electronic part (the thinned semiconductor chip, or the like) are flip-chip connected to the connecting pads of the wiring substrate that includes the wiring patterns having the connecting pads. Then, the bumps of the second electronic part (the semiconductor chip, or the like) having a larger area than an area of the first electronic part are flip-chip connected to the connecting pads arranged on the outside of the periphery of the first electronic part. That is, a height of the bumps of the second electronic part is set higher than a thickness that contains the bumps of the first electronic part, and the second electronic part is packaged on the wiring substrate at a predetermined interval from the upper surface of the first electronic part, and the first electronic part is installed in a space between the lower surface of the second electronic part and the wiring substrate.

Then, the filling insulating body (the underfill resin) is filled in the clearance between the first electronic part and the wiring substrate and clearances between the second electronic part and the first electronic part and the wiring substrate, and thus the first electronic part is buried in the filling insulating body.

In the related arts 1 and 2 described later, the method of forming a flat insulating film on the electronic parts by eliminating easily the level difference caused by the electronic parts is explained. In the related arts 1 and 2, the special steps such as the step of patterning the insulating film having the opening portion in the packaging area, the step of forming the flat interlayer insulating film by filling the insulating film in the clearances between the electronic parts packaged in the packaging area and the insulating film, etc. are required. In addition, in the related arts 1 and 2, the insulating film used to bury the electronic parts has such disadvantages that the crack resistance is low, the sufficient flatness cannot be obtained, etc.

In contrast, in the present invention, the first and second semiconductor chips are flip-chip connected in sequence to the wiring substrates manufactured by the normal manufacturing method such that the first semiconductor chip is installed in the space under the second semiconductor chip, and then the filling insulating body (underfill resin) is filled at a time in the clearances under the first and second semiconductor chips. Therefore, the first semiconductor chip is easily buried in the filling insulating body (underfill resin) having the high crack resistance and then packaged.

As a result, the manufacturing steps become very simple rather than the related arts 1 and 2 described later. Thus, reduction in a production cost can be attained and also the reliability such as the crack resistance of the insulating film in which the electronic parts is buried, etc. can be improved.

Also, unlike the related arts 1 and 2 described later, there is no necessity to mate the film thickness of the insulating film of the wiring substrate with the thickness of the electronic parts. Therefore, since the film thickness of the insulating film can be adjusted appropriately to meet the characteristics of the wiring substrate, an overall thickness of the electronic parts built-in substrate can be thinned.

DETAILED DESCRIPTION OF THE PREFERRED EMBODIMENT

An embodiment of the present invention will be explained with reference to the drawings hereinafter.

The related arts having relevance to the present invention and their disadvantages will be explained prior to explanation of the embodiment of the present invention.

(Related Art 1)

Figure 1A:
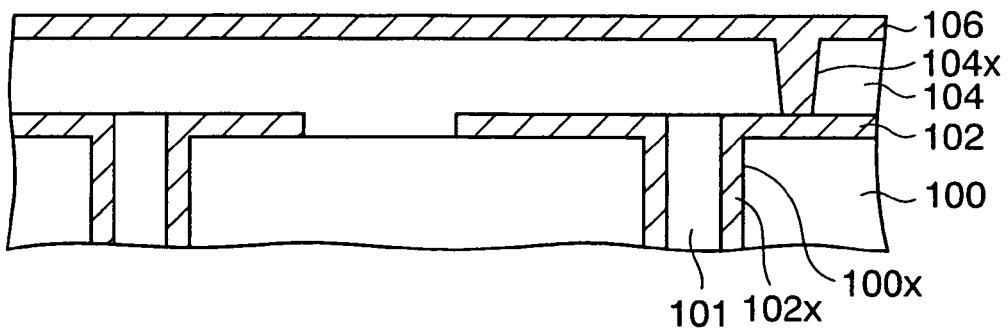
FIGS. 1A to 1E are sectional views showing a method of manufacturing an electronic parts built-in substrate according to the related art 1.

In the method of manufacturing the electronic parts built-in substrate according to the related art 1, as shown in FIG. 1A, first an insulating base substrate 100 to manufacture a built-up wiring substrate is prepared. Through holes 100x are provided in the base substrate 100, then through-hole plating layers 102x connected to first wiring patterns 102 are formed on inner surfaces of the through holes 100x, and then the openings are buried with a resin body 101.

Then, a first interlayer insulating film 104 made of resin to coat the first wiring patterns 102 is formed. Then, predetermined portions of the first interlayer insulating film 104 on the first wiring patterns 102 are worked by the laser or the RIE. Thus, first via holes 104x each having a depth that reaches the first wiring pattern 102 are formed. Then, a second wiring pattern 106 connected to the first wiring patterns 102 via the first via holes 104x is formed on the first interlayer insulating film 104.

Figure 1B:
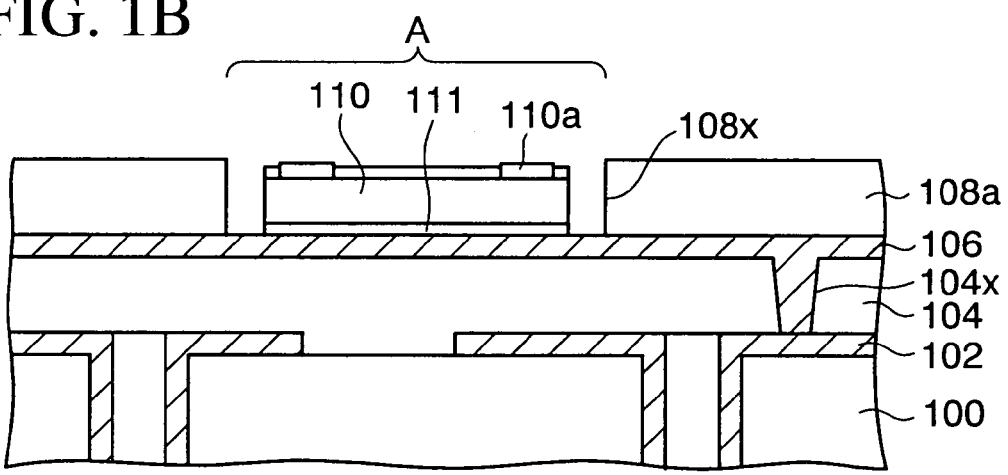

Then, as shown in FIG. 1B, a first insulating film 108a having an opening portion 108x in a packaging area A, in which the semiconductor chip is flip-chip mounted, of the second wiring pattern 106 and the first interlayer insulating film 104 is formed.

Then, a semiconductor chip 110 which has connection terminals 110a and whose thickness is thinned up to about 150 f̂Êm or less is prepared. Then, a back surface of the semiconductor chip 110 is secured onto the wiring pattern 106 via an adhesive layer 111 such that the connection terminals 110a of the semiconductor chip 110 are directed upward. At this time, since the first insulating film 108a is formed in areas except the packaging area A to have a film thickness almost equal to a thickness of the semiconductor chip 110, an upper surface of the semiconductor chip 110 and an upper surface of the first insulating film 108a have an almost same height respectively and therefore the level difference caused by the semiconductor chip 110 is overcome.

Figure 1C:
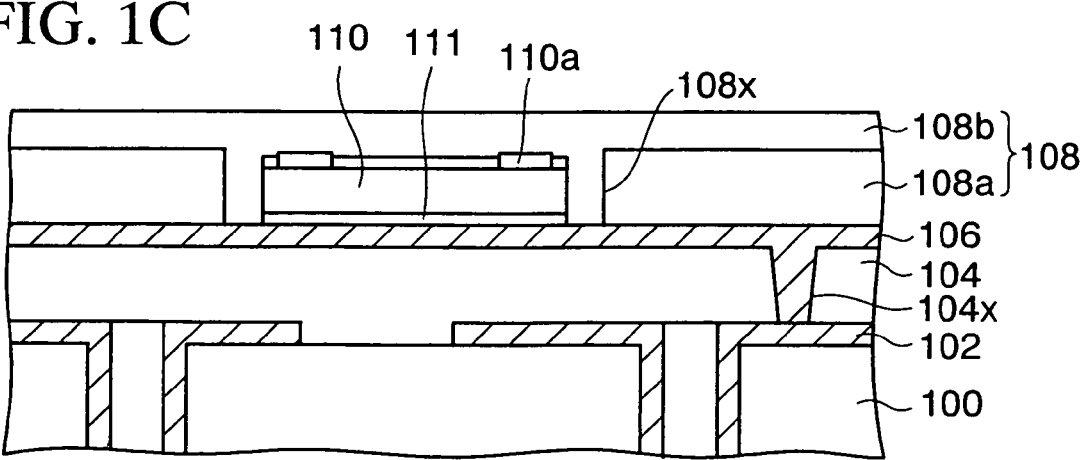

Then, as shown in FIG. 1C, a second insulating film 108b is formed by pasting a resin film on the semiconductor chip 110 and the first insulating film 108a. At this time, the second insulating film 108b is filled in clearances between side surfaces of the semiconductor chip 110 and side surfaces of the opening portion 108x in the first insulating film 108a to form a coplanar upper surface.

In this manner, a second interlayer insulating film 108 consisting of the first insulating film 108a and the second insulating film 108b is obtained. Thus, the structure in which the semiconductor chip 110 is face-up buried in the flat second interlayer insulating film 108 and packaged is obtained.

Figure 1D:
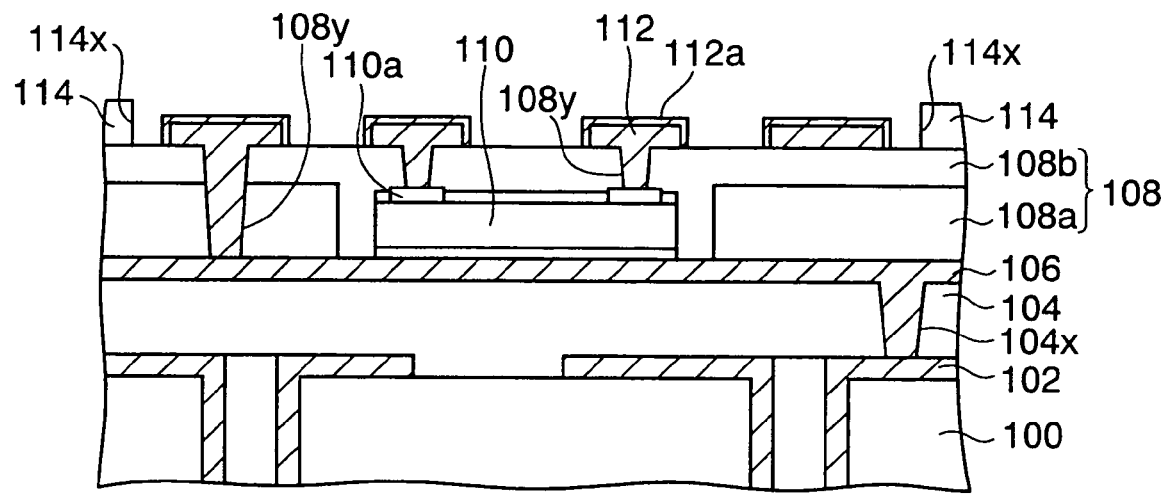

Then, as shown in FIG. 1D, second via holes 108y are formed in predetermined portions in the second interlayer insulating film 108 on the connection terminals 110a of the semiconductor chip 110 and the second wiring pattern 106. Then, third wiring patterns 112 connected to the connection terminals 110a of the semiconductor chip 110 and the second wiring pattern 106 via the second via holes 108y respectively are formed on the second interlayer insulating film 108.

Then, a solder resist film 114 having an opening portion 114x to expose predetermined portions of the third wiring patterns 112 is formed on the second interlayer insulating film 108. Then, Ni/Au layers 112a are formed on the third wiring patterns 112 in the opening portion 114x by the electroless plating.

Figure 1E:
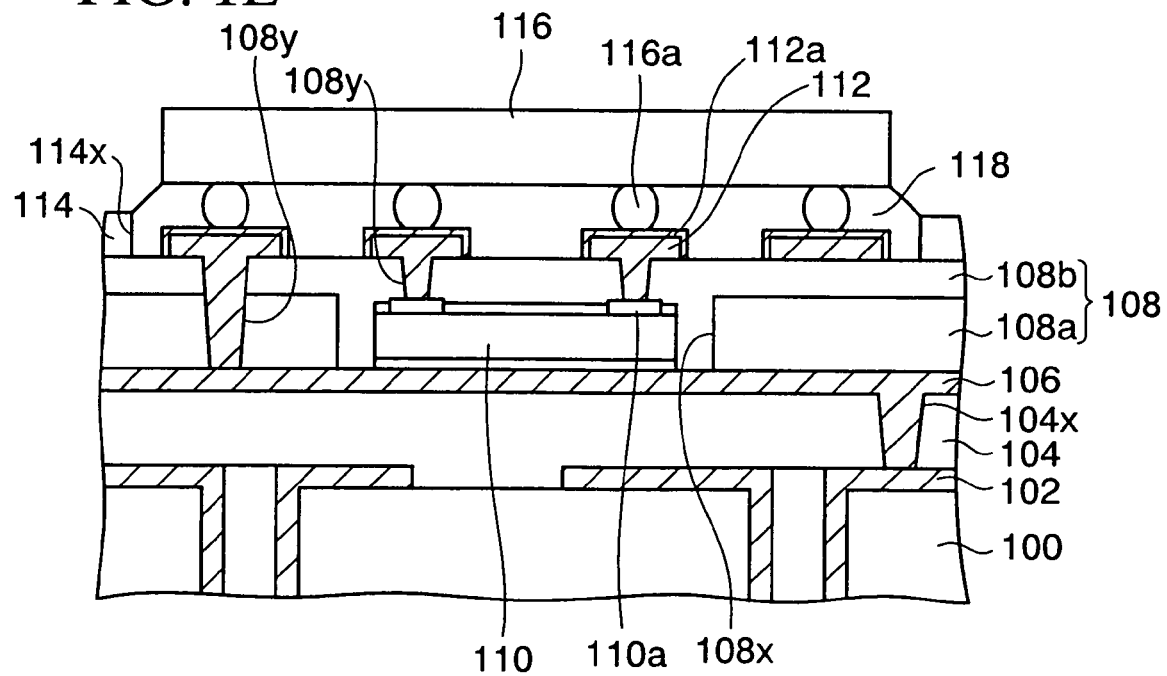

Then, as shown in FIG. 1E, bumps 116a of an upper semiconductor chip 116 with the bumps 116a are flip-chip connected to the Ni/Au plating layers 112a on the third wiring patterns 112. Then, an underfill resin 118 is filled in clearances under the upper semiconductor chip 116. With the above, the electronic parts built-in substrate of the related art 1 can be obtained.

In the electronic parts built-in substrate of the related art 1, the level difference caused due to the semiconductor chip 110 when the semiconductor chip 110 is buried in the second interlayer insulating film 108 can be easily eliminated, nevertheless a crack is prone to occur in portions of the second insulating film (resin film) 108b buried in the clearances on the outside of the periphery of the semiconductor chip 110 (in particular, the portions corresponding to the corner portions of the semiconductor chip) when the temperature cycle test is applied in the range of 125 to −55 □ Z. Therefore, the measure must be taken such that a special resin film having a high crack resistance should be used as the second insulating film 108b, and so forth, and it is possible that an increase in a production cost is brought about.

(Related Art 2)

Figure 2A:
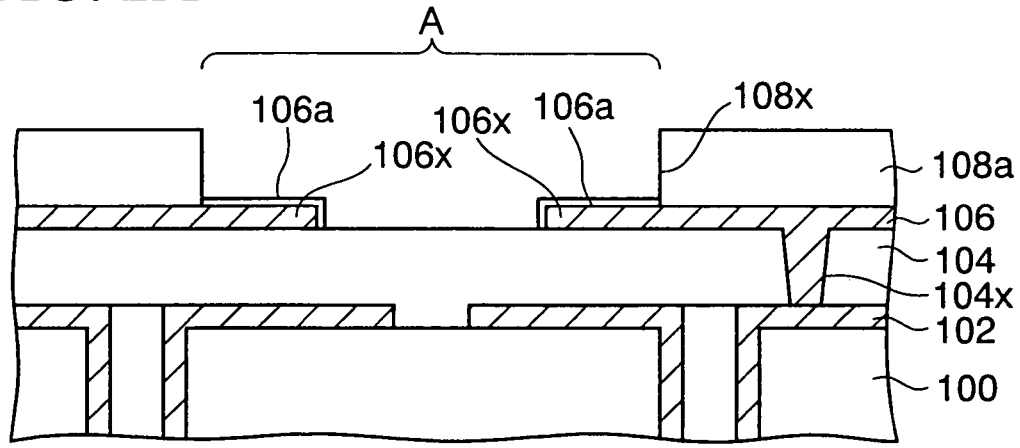
FIGS. 2A to 2E are sectional views showing a method of manufacturing an electronic parts built-in substrate according to the related art 2.

In the method of manufacturing the electronic parts built-in substrate according to the related art 2, as shown in FIG. 2A, first the base substrate 100 having the first wiring patterns 102 is prepared, like the related art 1. Then, the second wiring patterns 106 connected to the first wiring patterns 102 via the first via holes 104x formed in the first interlayer insulating film 104 are formed on the first interlayer insulating film 104. Then, the first insulating film 108a having the opening portion 108x in the packaging area A in which the semiconductor chip is mounted is formed. At this time, connecting pads 106x of the second wiring patterns 106, to which the semiconductor chip is flip-chip connected later, are exposed from the packaging area A. Then, Ni/Au layers 106a are formed on the connecting pads 106x of the second wiring patterns 106, which are exposed from the packaging area A, by the electroless plating.

Figure 2B:
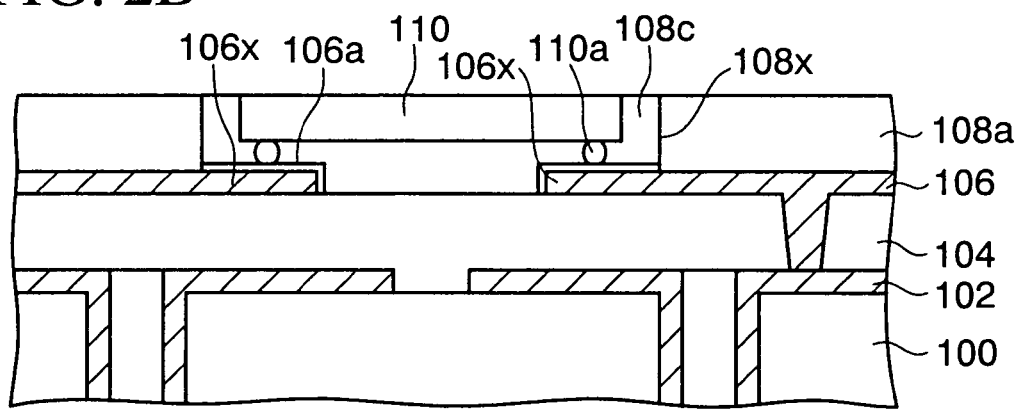
Figure 2C:
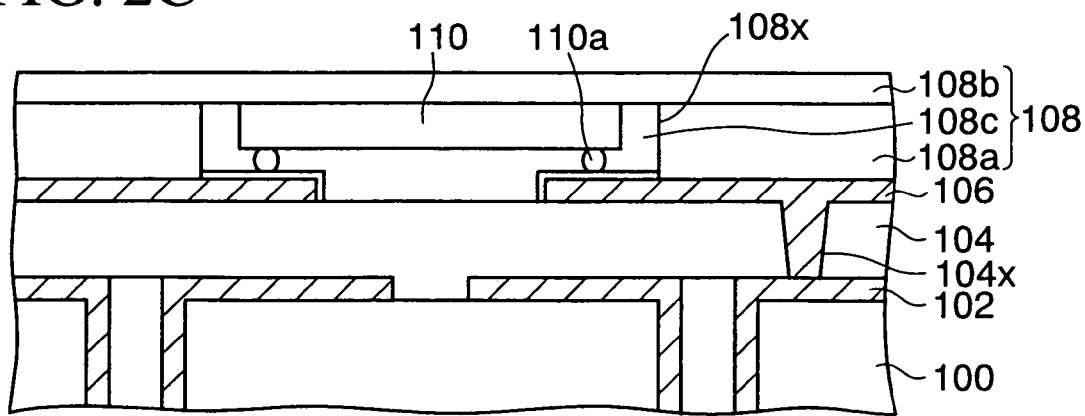

Then, as shown in FIG. 2B, the semiconductor chip 110 which has the bumps 110a and whose thickness is thinned up to about 150 f̂Êm or less is prepared. Then, the bumps 110a of the semiconductor chip 110 are flip-chip connected to the Ni/Au layers 106a on the connecting pads 106x of the second wiring patterns 106. Then, an underfill resin 108c is filled in the clearances under the semiconductor chip 110 and the clearances between the side surfaces of the semiconductor chip 110 and the side surfaces of the opening portion 108x in the first insulating film 108a. Then, as shown in FIG. 2C, the second insulating film 108b is formed on the upper surface of the semiconductor chip 110. Thus, the second interlayer insulating film 108 consisting of the first insulating film 108a, the second insulating film 108b, and the underfill resin 108c is obtained.

Figure 2D:
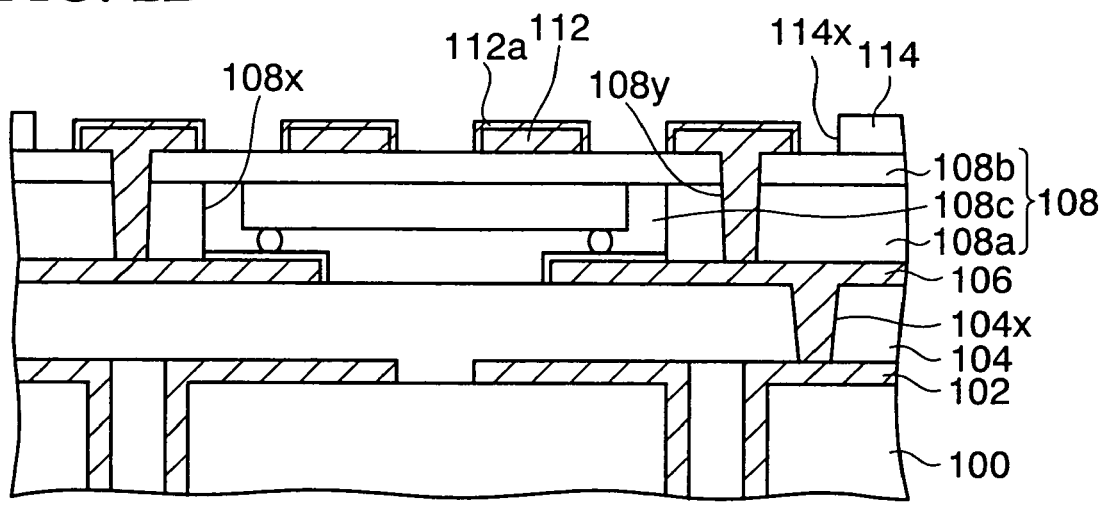

Then, as shown in FIG. 2D, the second via holes 108y are formed in the predetermined portions in the second interlayer insulating film 108 on the second wiring patterns 106. Then, the third wiring patterns 112 connected to the second wiring patterns 106 via the second via holes 108y are formed on the second interlayer insulating film 108.

Then, the solder resist film 114 having the opening portion 114x to expose the predetermined portions of the third wiring patterns 112 is formed on the second interlayer insulating film 108. Then, the Ni/Au layers 112a are formed on the third wiring patterns 112, which are exposed from the opening portion 114x, by the electroless plating.

Figure 2E:
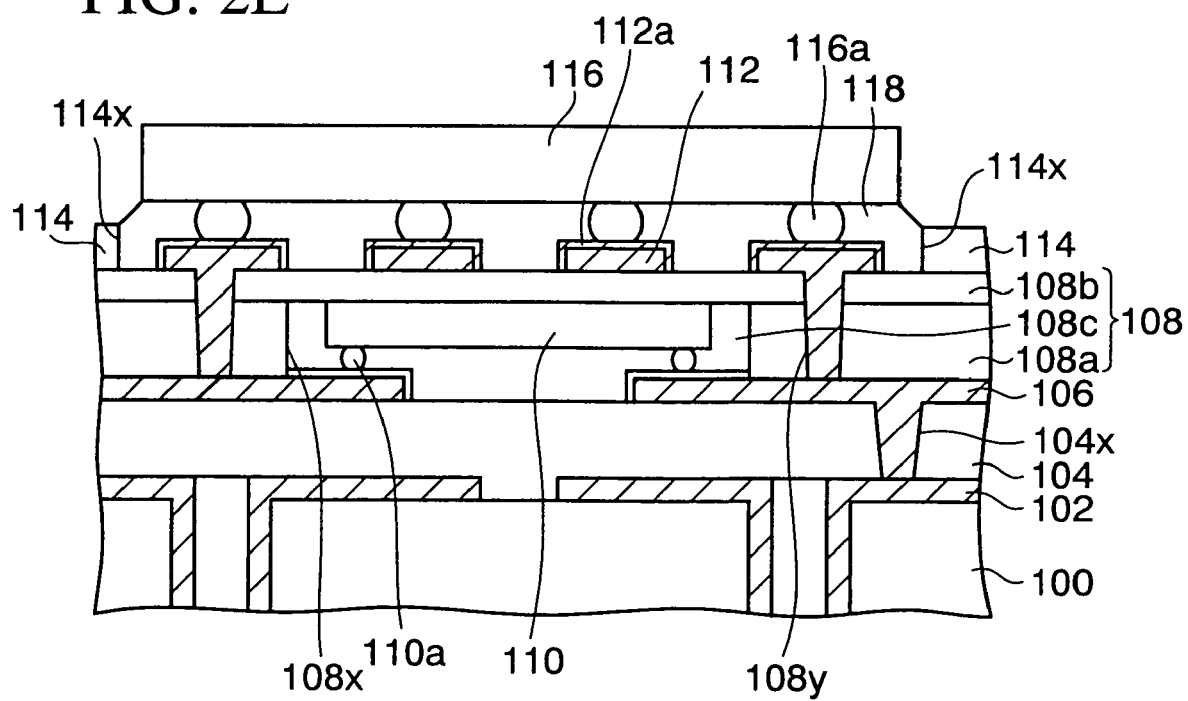

Then, as shown in FIG. 2E, the bumps 116a of an upper semiconductor chip 116 having the bumps 116a are flip-chip connected to the Ni/Au layers 112a on the third wiring patterns 112. Then, the underfill resin 118 is filled in the clearances under the upper semiconductor chip 116. With the above, the electronic parts built-in substrate of the related art 2 can be obtained.

In the electronic parts built-in substrate of the related art 2, like the related art 1, the level difference caused due to the semiconductor chip 110 when such semiconductor chip 110 is buried in the first interlayer insulating film 108 can be easily eliminated. However, in the step of filling the underfill resin 108c in FIG. 2B, it is difficult to control a supply amount of the underfill resin 108c in such a way that the upper surface of the underfill resin 108c and the upper surface of the semiconductor chip 110 constitute a coplanar surface. Therefore, in many cases the underfill resin 108c is formed to rise around the peripheral portion of the semiconductor chip 110. As a result, a height of the third wiring patterns 112 formed over this resin is varied and thus the reliability of the electrical bonding of the upper semiconductor chip 116 is lowered.

In this manner, according to the related art 2, since the measure must be taken such that the planarizing step should be particularly added, etc., it is possible that an increase in a production cost is brought about.

An electronic parts built-in substrate according to an embodiment of the present invention to be explained in the following can overcome disadvantages of the above related arts 1 and 2.

(Embodiment)

Figure 3A:
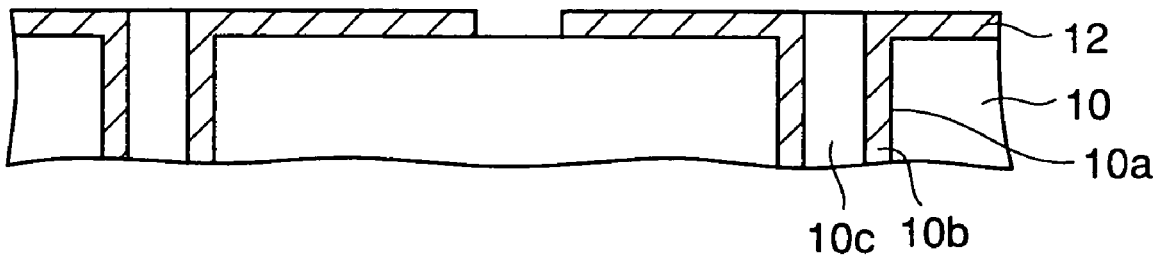
FIGS. 3A to 3H are sectional views showing a method of manufacturing an electronic parts built-in substrate according to an embodiment of the present invention.

FIGS. 3A to 3H are sectional views showing a method of manufacturing an electronic parts built-in substrate according to an embodiment of the present invention in order. As shown in FIG. 3A, first a base substrate 10 is prepared to manufacture a build-up wiring substrate. This base substrate 10 is made of insulating material such as glass epoxy resin, or the like. Through holes 10a are provided in the base substrate 10, then a through-hole plating layer 10b connected to a first wiring pattern 12 on the base substrate 10 respectively is formed on inner surfaces of the through holes 10a, and then the openings are buried with a resin body 10c.

Figure 3B:
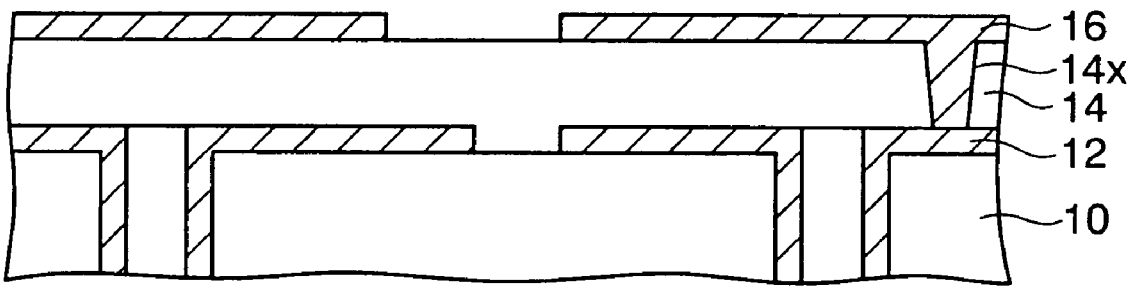

Then, as shown in FIG. 3B, a first interlayer insulating film 14 is formed on the first wiring patterns 12. As the first interlayer insulating film 14, a resin such as epoxy resin, polyimide resin, polyphenylene ether resin, or the like may be employed. As an example of the forming method, a resin film is formed by laminating a resin film on the first wiring patterns 12 and then thermally treating the film at 80 to 140 □Ž to cure. Alternately, the resin film may be formed by the spin coating method or the printing.

Then, predetermined portions of the first interlayer insulating film 14 on the first wiring patterns 12 are worked by the laser or the RIE. Thus, first via holes 14x each having a depth that reaches the first wiring pattern 12 are formed. Then, second wiring patterns 16 connected to the first wiring patterns 12 via the first via holes 14x are formed on the first interlayer insulating film 14 by the semi-additive process.

To explain in detail, a seed Cu layer (not shown) is formed on inner surfaces of the first via holes 14x and the first interlayer insulating film 14 by the electroless plating or the sputter method, and then a resist film (not shown) having opening portions that correspond to the second wiring patterns 16 is formed. Then, Cu film patterns (not shown) are formed in the opening portions in the resist film by the electrolytic plating using the seed Cu layer as a plating power-supply layer. Then, the resist film is removed and then the seed Cu film is etched while using the Cu film patterns as a mask. In this case, the subtractive process or the full additive process may be used in place of the semi-additive process.

Figure 3C:
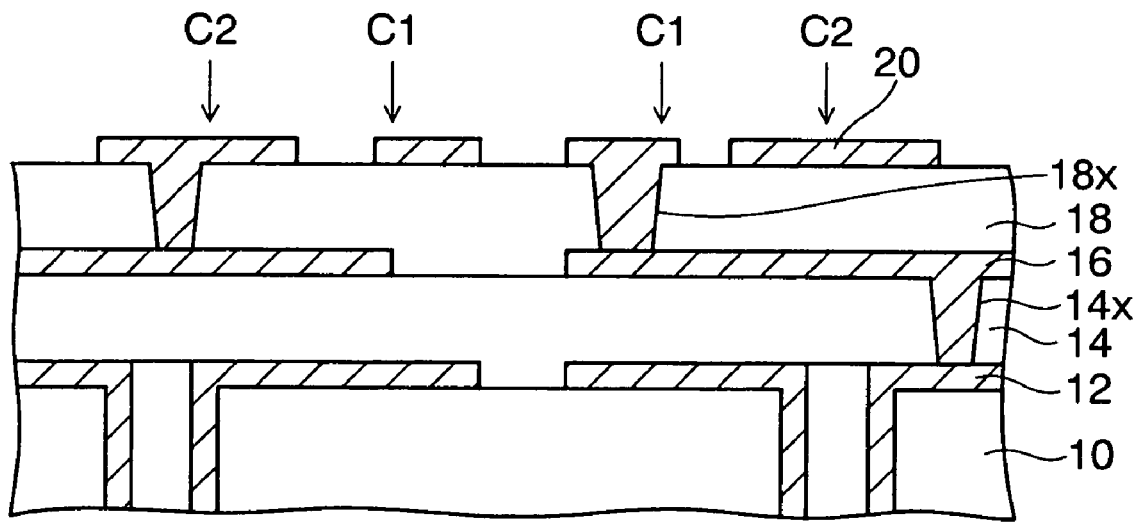

Then, as shown in FIG. 3C, a second interlayer insulating film 18 made of the same material as the first interlayer insulating film 14 is formed on the second wiring patterns 16, and then second via holes 18x are formed in predetermined portions of the second interlayer insulating film 18 on the second wiring patterns 16. Then, third wiring patterns 20 connected to the second wiring patterns 16 via the second via holes 18x are formed on the second interlayer insulating film 18 by the same method as the method of forming the second wiring patterns 16.

At this time, the third wiring patterns 20 are formed in a state that a first connecting pad C1 to which the bump of the first semiconductor chip is connected later and a second connecting pad C2 to which the bump of the second semiconductor chip is connected are provided thereto.

Figure 3D:
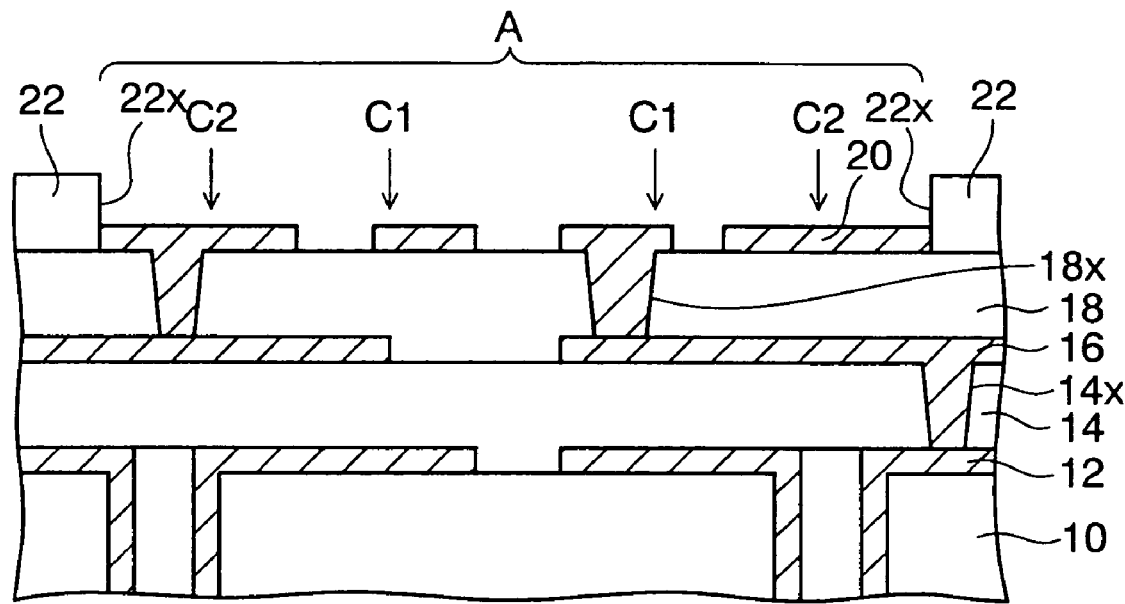

Then, as shown in FIG. 3D, a solder resist film 22 (protection insulating film) having an opening portion 22x to expose collectively the packaging area A, in which a plurality of first, second connecting pads C1, C2 of the third wiring patterns 20 are arranged, is formed. That is, the solder resist film 22 is formed to surround the packaging area A.

Figure 3E:
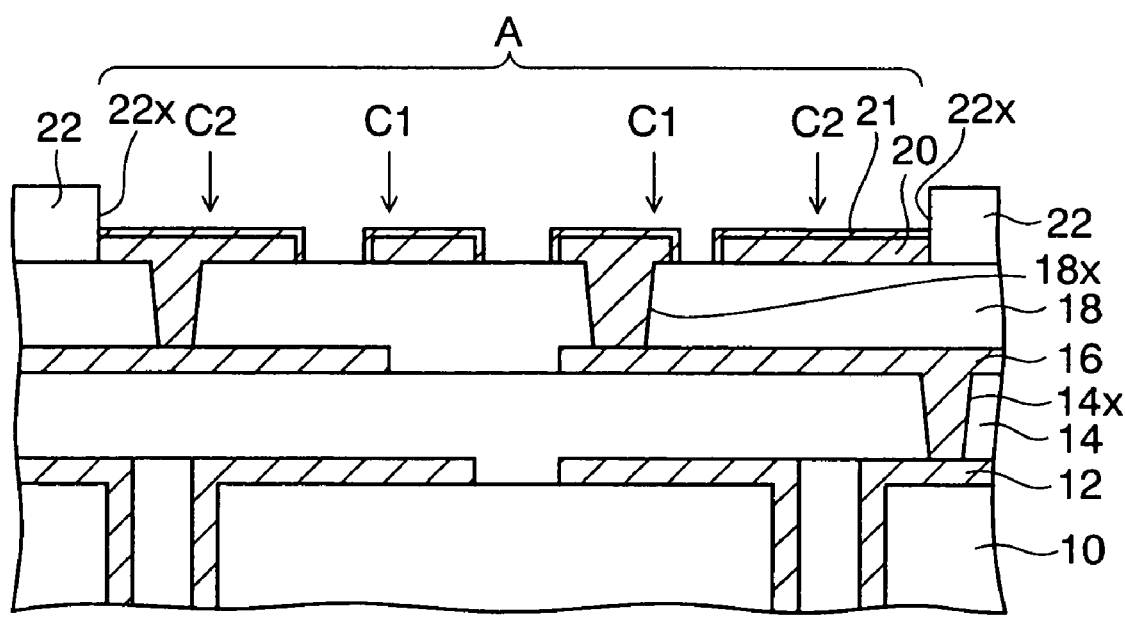
Figure 3F:
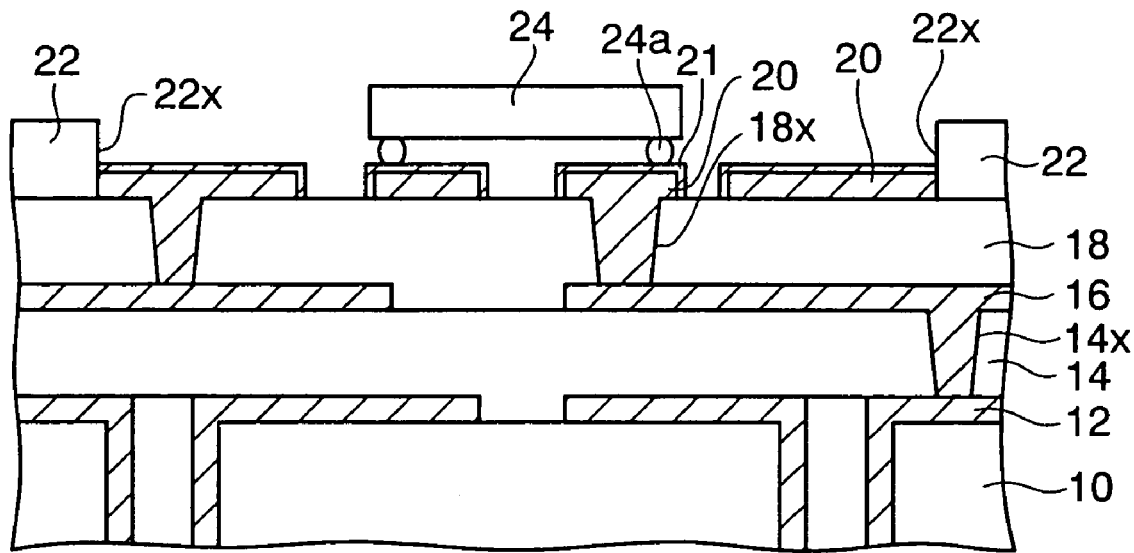

Then, as shown in FIG. 3F, a first semiconductor chip 24 (first electronic part) having bumps 24a is prepared. This semiconductor chip 24 is obtained by grinding a semiconductor wafer (not shown) having elements such as transistors, etc. and connecting terminals on the element forming surface side to reduce a thickness and then dicing the semiconductor wafer into individual pieces. The semiconductor chip 24 (except the bumps 24a) is reduced in thickness up to 150 ƒÊm or less, preferably 10 to 100ƒÊm. The bumps 24a of the first semiconductor chip 24 are formed on the connecting terminals of the semiconductor chip 24, before or after the semiconductor wafer is subjected to the dicing.

Then, the bumps 24a of the first semiconductor chip 24 are flip-chip connected to the Ni/Au layers 21 on the first connecting pads C1 of the third wiring patterns 20 (FIG. 3E). As the bumps 24a of the first semiconductor chip 24, the Au bump, the solder bump, or the like may be used. When the Au bump is used, Au and Au are bonded by the ultrasonic wave. Also, when the solder bump is used, the solder and Au are bonded by the reflow heating.

Figure 3G:
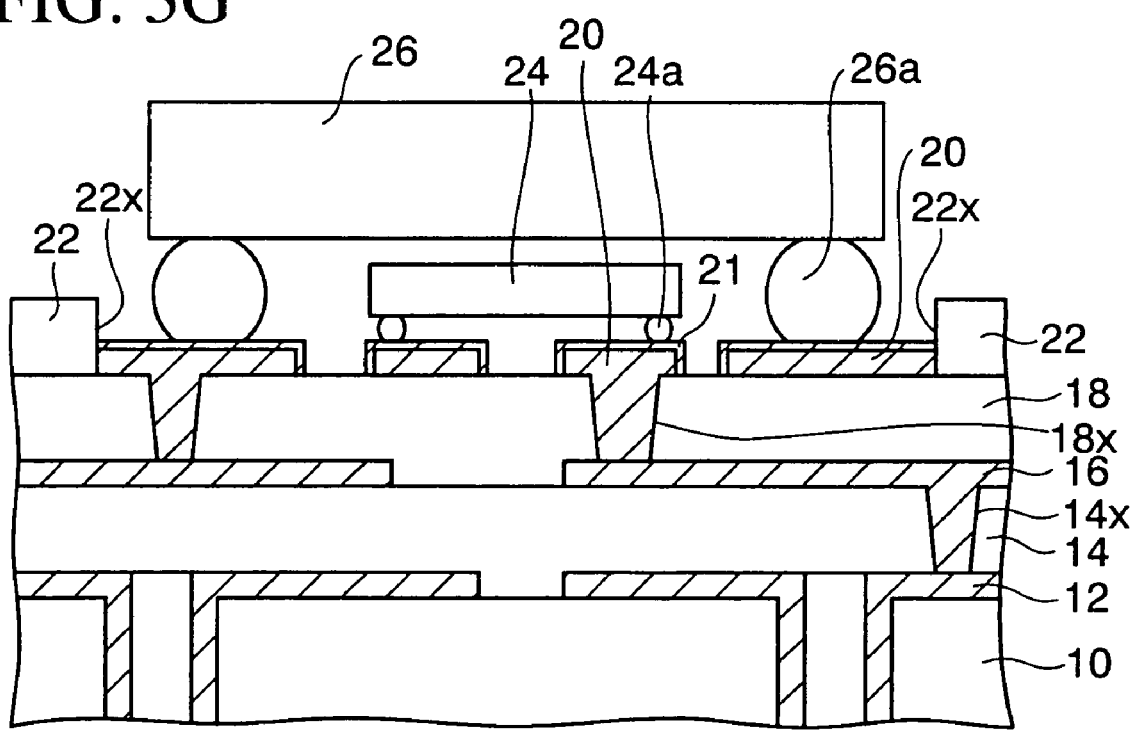

Then, as shown in FIG. 3G, a second semiconductor chip 26 (second electronic part) having bumps 26a and having an area that is larger than an area of the first semiconductor chip 24 is prepared. The bumps 26a of the second semiconductor chip 26 are flip-chip connected to the NiIAu layers 21 on the second connecting pads C2 of the third wiring patterns 20 (FIG. 3E) arranged on the outside of the periphery of the first semiconductor chip 24. Accordingly, the second semiconductor chip 26 is packaged at a predetermined interval from the upper surface of the first semiconductor chip 24, and the first semiconductor chip 24 is installed into a space between the lower surface of the second semiconductor chip 26 and the wiring substrate.

As a consequence, a height of the bumps 26a of the second semiconductor chip 26 is set higher than a thickness containing the bumps 24a of the first semiconductor chip 24. As an example of this, a height of the bumps 26a of the second semiconductor chip 26 is set to about 100 ƒÊm when a thickness of the first semiconductor chip 24 is about 50 ƒÊm and a height of the bumps 24a is about 20 ƒÊm.

In this case, the semiconductor chip is taken as an example of the electronic parts. But various electronic parts such as the capacitor parts, or the like may be employed.

Figure 3H:
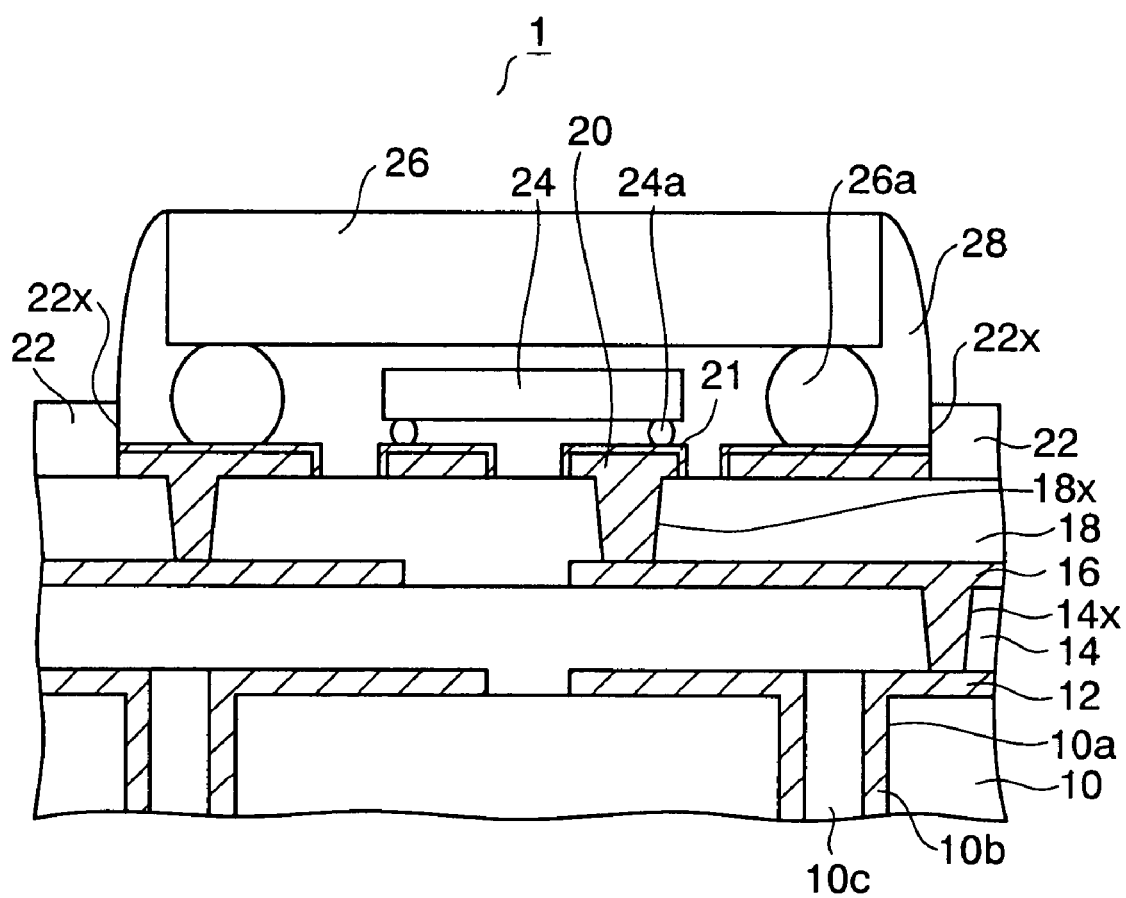

Then, as shown in FIG. 3H, a filling insulating body 28 is formed by filling the underfill resin in the clearance under the first semiconductor chip 24, the clearances on both surface sides of the first semiconductor chip 24, the clearance between the upper surface of the first semiconductor chip 24 and the lower surface of the second semiconductor chip 26, and the clearances between the side surfaces of the second semiconductor chip 26 and the opening portion 22x of the solder resist film 22 and then thermally treating the resin to cure. Thus, not only the first semiconductor chip 24 is buried in the filling insulating body 28 but also the clearances under the second semiconductor chip 26 and on the side surface side thereof are filled with the filling insulating body 28. The filling insulating body 28 on the side surface side of the second semiconductor chip 26 is formed in a state that such body is dammed up by the side surface of the opening portion 22x of the solder resist film 22.

As the filling insulating body 28, in order to improve the reliability such as the crack resistance, etc., it is preferable that the resin which contains filler (silica), and has a coefficient of thermal expansion (CTE) of 20 to 30 ppm/□Ž and has a Young's modulus of 10 to 15 GPa is used.

In this fashion, the first semiconductor chip 24 is mounted on the wiring substrate in a state that such first semiconductor chip 24 is buried in the filling insulating body 28, and the second semiconductor chip 26 is mounted on the wiring substrate in a state that such second semiconductor chip 26 is stacked three-dimensionally over the first semiconductor chip 24.

With the above, an electronic parts built-in substrate 1 of the present embodiment is completed.

In this case, as described above, in the present embodiment, in order to bury the first semiconductor chip 24 in the filling insulating body 28, the solder resist film 22 having the opening portion 22x to expose collectively the packaging area A in which a plurality of first, second connecting pads C1, C2 are arranged is formed. Such structure is also suitable from such a respect that a desired bonding area can be assured upon bonding the bumps 24a, 26a of the semiconductor chips 24, 26 to the connecting pads C1, C2 and thus the reliability of the electrical bonding can be improved, even though a pitch between the connecting pads C1, C2 is narrowed (e.g., about 150 ƒÊm or less).

In other words, if the method of forming the continuous solder resist film having the opening portions that expose the major portions of the connecting pads C1, C2 of the third wiring patterns 20 respectively is employed, the opening portions in the solder resist film are liable to displace from the major portions of the connecting pads C1, C2 in formation due to displacements in the forming step when a pitch between the connecting pads C1, C2 is narrowed. Therefore, the bonding area between the bumps of the semiconductor chip and the connecting pads C1, C2 is reduced and the bonding failure, and the like are readily caused with the reduction in a bonding strength of the bumps.

In the electronic parts built-in substrate 1 of the present embodiment, the first to third wiring patterns 12, 16, 20 are formed on the base substrate 10 in a multi-layered fashion, and then these wiring patterns 12, 16, 20 are connected mutually via the first and second via holes 14x, 18x provided in the first and second interlayer insulating films 14, 18. The third wiring patterns 20 have a plurality of connecting pads C1, C2, and the solder resist film 22 having the opening portion 22x to expose collectively the packaging area A in which the first, second connecting pads C1, C2 are arranged is formed on the second interlayer insulating film 18. Then, the bumps 24a of the first semiconductor chip 24 are flip-chip connected to the Ni/Au layers 21 on the first connecting pads C1 of the third wiring patterns 20.

Also, the bumps 26a of the second semiconductor chip 26, which have a larger area than an area of the first semiconductor chip 24, are flip-chip connected to the Ni/Au layers 21 on the second connecting pads C2 arranged on the outside of the periphery of the first semiconductor chip 24. Then, a height of the bumps 26a of the second semiconductor chip 26 is set higher than a thickness containing the bumps 24a of the first semiconductor chip 24, whereby the first semiconductor chip 24 is installed into an area between the lower surface of the second semiconductor chip 26 and the wiring substrate.

In addition, the filling insulating body 28 is filled in the clearances under the first semiconductor chip 24 and the second semiconductor chip 26 and on the side surface sides thereof, and the first semiconductor chip 24 is mounted to be buried in the filling insulating body 28.

In this manner, in the present embodiment, the first semiconductor chip 24 is buried in the filling insulating body 28 made of the underfill resin for which the material having a high crack resistance can be easily chosen. For this reason, no crack is generated in the filling insulating body 28 on the peripheral portion of the first semiconductor chip 24 during the temperature cycle test, and thus the reliability of the electronic parts built-in substrate 1 can be improved.

Also, in the related arts 1 and 2, in order to form a flat insulating film on the electronic parts by eliminating easily the level difference caused by the first semiconductor chip 24, the special steps such as the step of patterning the insulating film having the opening portion in the packaging area, the step of forming the flat interlayer insulating film by filling the insulating film in the clearances between the electronic parts packaged in the packaging area and the insulating film, etc. are required.

In contrast, in the present embodiment, the first and second semiconductor chips 24, 26 are flip-chip connected in sequence to the wiring substrates manufactured by the normal manufacturing method such that the first semiconductor chip 24 is installed in the space under the second semiconductor chip 26, and then the filling insulating body 28 is filled at a time in the clearances under the first and second semiconductor chips 24, 26. Therefore, the electronic parts built-in substrate 1 of the present embodiment can be manufactured by very simple manufacturing steps and at a low cost rather than the related arts 1 and 2.

Also, unlike the related art 2, since there is no necessity to consider the flatness in forming the filling insulating body 28, there is no necessity to control finely a supply amount of the underfill resin.

Further, unlike the related arts 1 and 2, it is not required that the film thickness of the insulating film of the wiring substrate should be formed to coincide with the thickness of the semiconductor chip. Therefore, since the film thickness of the insulating film can be adjusted appropriately to meet the characteristics of the wiring substrate, an overall thickness of the electronic parts built-in substrate can be adjusted thinly rather than the related arts 1 and 2.

In this case, in the present embodiment, the substrate in which three wiring patterns are stacked on the base substrate is exemplified as the wiring substrate. But various wiring substrates in which the wiring patterns are provided in the n-layered (n is an integer of 1 or more) fashion may be employed. Also, a mode in which the n-layered (n is an integer of 1 or more) wiring pattern is also formed on the back surface side of the base substrate 10 may be employed.

What is claimed is:

1. A method of manufacturing an electronic parts built-in substrate comprising the steps of:

preparing a wiring substrate including a wiring pattern having connecting pads;

forming a protection insulating film having an opening portion that exposes collectively a plurality of connecting pads of the wiring pattern on the wiring substrate by patterning a resist film;

forming a plating layer on the wiring pattern containing the connecting pads in the opening portion of the protection insulating film;

flip-chip connecting a bump of a first electronic part to the connecting pad;

flip-chip connecting a bump of a second electronic part to the connecting pad arranged on an outside of a periphery of the first electronic part to package the second electronic part at a predetermined interval from an upper surface of the first electronic part; and filling a filling insulating body in a clearance between the first electronic part and the wiring substrate, and clearances between the second electronic part and the first electronic part, and the wiring substrate, to bury the first electronic part in the filling insulating body, the filling insulating body being formed to extend from a side surface of the second electronic part to a side surface of the opening portion of the protection insulating film.

2. The method of manufacturing an electronic parts built-in substrate according to claim 1, wherein a height of the bump of the second electronic part is set higher than a thickness that contains the bump of the first electronic part.

3. The method of manufacturing an electronic parts built-in substrate according to claim 1, wherein a thickness of the first electronic part except the bump, is 150 μm or less.

4. The method of manufacturing an electronic parts built-in substrate according to claim 1, wherein the filling insulating body is formed of a resin containing a filler and having a coefficient of thermal expansion of 20 to 30 ppm/° C.

5. The method of manufacturing an electronic parts built-in substrate according to claim 1, wherein the electronic part is a semiconductor chip.

* * * * *